(12) United States Patent
Krishnamurty

(10) Patent No.: US 6,621,314 B2
(45) Date of Patent: Sep. 16, 2003

(54) DELAY LOCKED LOOP

(75) Inventor: Lakshminarayan Krishnamurty, Tempe, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/960,998

(22) Filed: Sep. 25, 2001

(65) Prior Publication Data

US 2003/0058014 A1 Mar. 27, 2003

(51) Int. Cl.$^7$ .................................................. H03L 7/06
(52) U.S. Cl. ........................ 327/158; 327/161; 327/269; 327/270; 327/271
(58) Field of Search ................................ 327/158, 161, 327/269, 270, 271, 276, 277, 156, 157

(56) References Cited

U.S. PATENT DOCUMENTS

| | | | | |
|---|---|---|---|---|
| 5,179,303 A | * | 1/1993 | Searles et al. | 327/277 |
| 5,663,665 A | * | 9/1997 | Wang et al. | 327/3 |
| 5,684,421 A | * | 11/1997 | Chapman et al. | 327/261 |
| 5,740,213 A | * | 4/1998 | Dreyer | 375/374 |
| 5,796,673 A | * | 8/1998 | Foss et al. | 365/233 |
| 5,939,901 A | * | 8/1999 | Geddes | 327/3 |
| 5,956,290 A | * | 9/1999 | Matsuzaki | 365/233 |
| 5,977,805 A | * | 11/1999 | Vergners et al. | 327/107 |
| 6,011,732 A | * | 1/2000 | Harrison et al. | 365/194 |
| 6,043,717 A | * | 3/2000 | Kurd | 331/17 |
| 6,204,705 B1 | * | 3/2001 | Lin | 327/161 |
| 6,208,183 B1 | * | 3/2001 | Li et al. | 327/161 |
| 6,125,364 A1 | * | 4/2001 | Hwang et al. | 331/57 |

* cited by examiner

Primary Examiner—Timothy P. Callahan
Assistant Examiner—An T. Luu
(74) Attorney, Agent, or Firm—Antonelli, Terry, Stout & Kraus, LLP (57) ABSTRACT

A delay locked loop having short acquisition time to lock. The voltage controlled delay line includes a series of stages with the delay of each stage being variable. However, the initial stage has a fixed delay to avoid latching of the final stage to the first stage of the next cycle. The phase detector has additional logic gating to suppress an extraneous up or down signal during the acquisition time.

26 Claims, 8 Drawing Sheets

DELAY LOCKED LOOP

FIELD

The present invention relates to a delay locked loop. More particularly, the present invention relates to a delay locked loop having a high-resolution voltage controlled delay line and a phase detector with no dead zone.

BACKGROUND

In many situations, such as for sampling incoming data, it is desirable to produce a series of periodic high frequency clock signals which are based on a reference clock signal. In such situations it is often desirable to use a phase locked loop, a synchronous delay line or a delay locked loop. These devices operate to keep the periodic clock signals synchronized with the reference clock. There may be an acquisition period during which the device brings the two signals into phase, before a lock condition occurs.

An example of a delay locked loop is seen in U.S. Pat. No. 6,002,281. In this patent, a reference clock signal clkin is sent through a delay line having a series of delay elements. Each element generates a pulse so that a series of pulses at equal intervals is produced. The output of the delay line is compared to the reference clock in a phase detector to determine the phase difference between the two clock signals. The phase detector then produces either up or down signals depending on how the phase needs to be changed. These two signals control the delay elements in the delay line. By changing the delay, the phase difference is also changed, until the clock signals are locked in phase with the reference clock.

This general type of delay locked loop is well known and operates in a generally satisfactory manner to produce a series of clock signals. However there are problems associated with this type of circuit arrangement. The delay line, in particular, has a problem that the time difference between the time signals is not always uniform. For example, if it is desired to have 8 timing signals at equal intervals of 100 picoseconds, it is not uncommon for mismatches to occur in loading or due to different rise times. Thus, the intervals may actually be only 75 picoseconds or as large as 110 picoseconds To make things worse, the eighth (and final) signal latches to the initial signal of the next cycle and so assumes all of the remaining time in the 800 picosecond cycle, so that the final interval will be as large as 275 picoseconds (800−7×75) or as small as 30 picoseconds (800−7×110) which is unacceptable.

Another problem occurs in the phase detector. In order to eliminate a dead zone, past systems have had both the up and down signals active at the same time. This dead zone is a phenomenon whereby the charge pump current reaches 0 at a small negative number value for the phase difference and remains at that level until a small positive number is reached. Thus, this causes a nonlinearity in the graph of the phase difference versus the charge pump current. In order to remove the dead zone, both the up and down outputs produce pulses at the same time, which lengthens the time to acquire lock.

It is thus desirable to eliminate these false pulses during acquisition conditions. During acquisition conditions both up and down signals are active with one of the signals being larger than the other. It is desirable to eliminate the smaller signal completely in order to acquire lock more quickly.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

SUMMARY OF THE INVENTION

DETAILED DESCRIPTION

Figure 1:
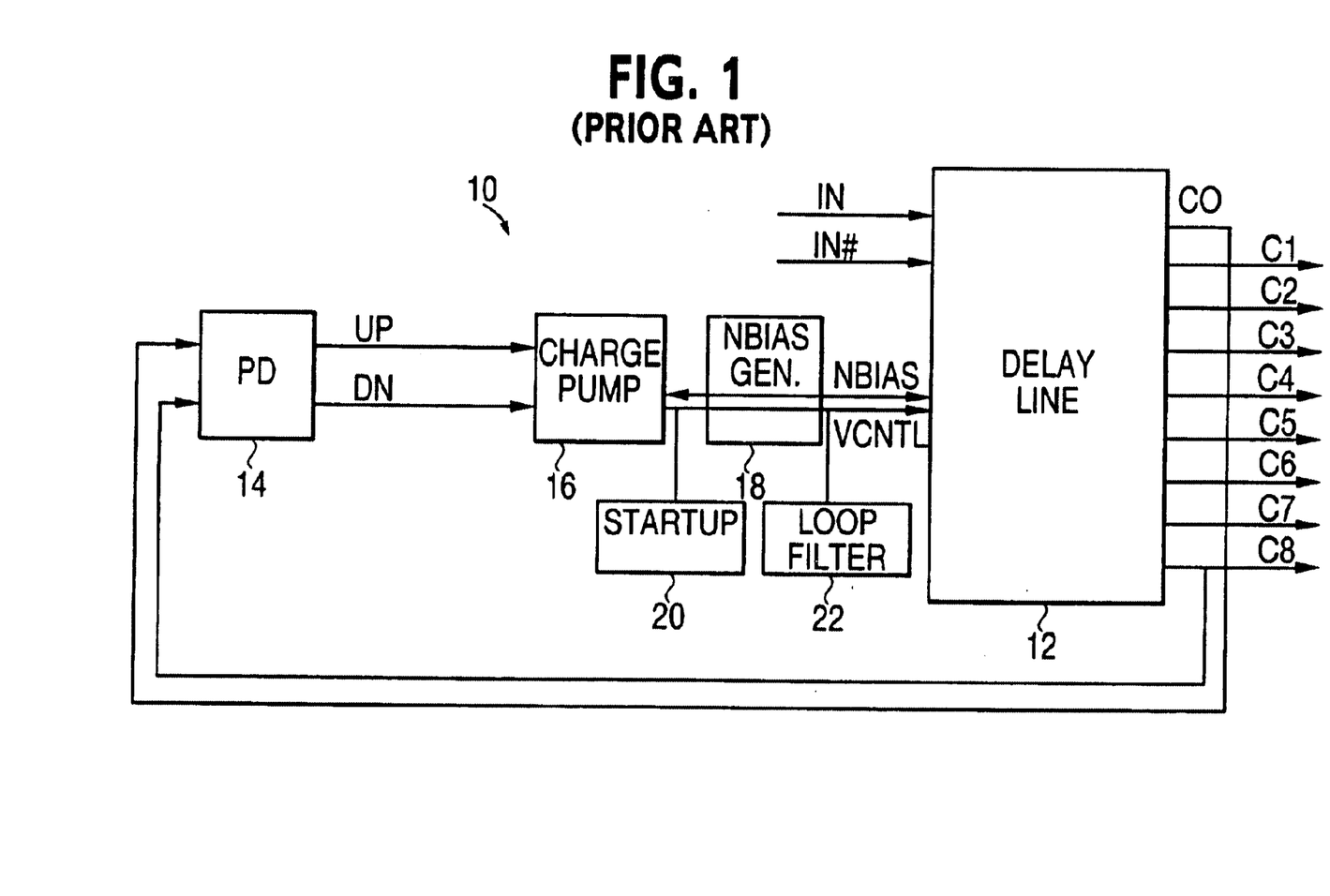
FIG. 1 is a block diagram of a prior art delay locked loop.

A more complete appreciation of the invention and many of the attendant advantages thereof will be readily obtained as the same becomes better understood by reference to the following detailed description when considered in connection with the accompanying drawings, wherein FIG. 1 shows a prior art device 10 including a delay locked loop. An input clock signal is applied to a voltage controlled delay line 12 which includes a series of delay elements. A series of output clock signals are generated from the delay elements. The first and last clock signal are also applied to phase detector 14 which compares the phase of the two signals. Either an up or down signal is generated depending on the direction of the phase difference of the two clock signals. The up and down signals are applied to a charge pump 16. The charge pump produces a voltage signal which controls the delay elements in the voltage controlled delay line. The charge pump also controls the Nbias generator 18 which also produces a signal to control the delay elements. A start-up device 20 sets the initial conditions when the loop is first started. A loop filter 22 contains a capacitor to which the charge pump 16 applies the control voltage in order to store it.

Figure 2:
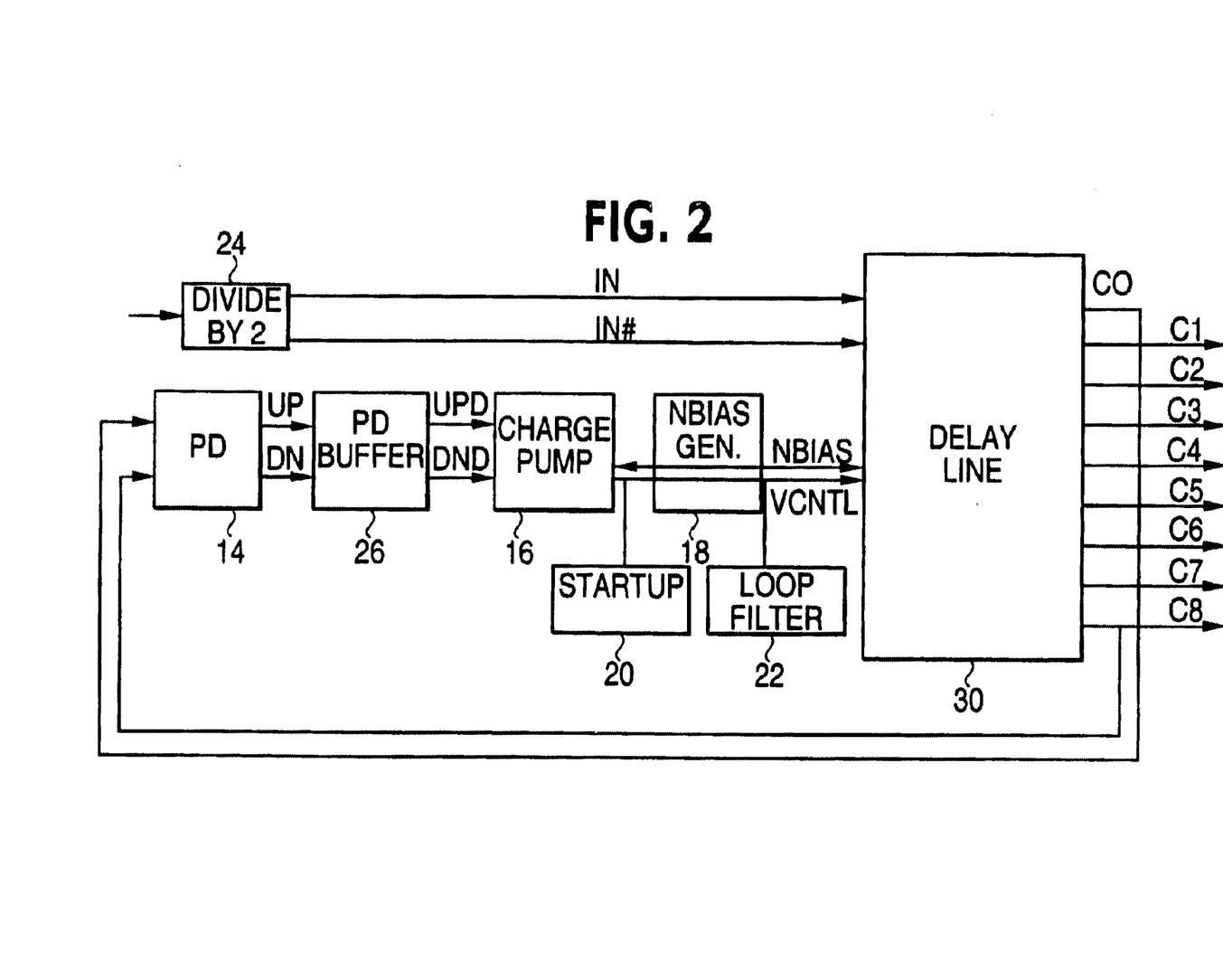
FIG. 2 is a block diagram of the present invention.

FIG. 2 is a block diagram showing in similar fashion the present invention. In this device the voltage controlled delay line 30 receives a clock signal and produces a series of output clock signals in a fashion similar to delay line 12. However, in this case, the input clock signal is first divided by two since a higher frequency clock signal is desired. Two clock signals such as the first and last clock signals from the delay line are applied to phase detector 14 in a similar fashion. The up and down signals from the phase detector are applied to buffer 26 to provide buffered up and down signals. These signals are applied to charge pump 16 in a similar fashion. The signal controls Nbias generator 18, and loop filter 22 in a similar fashion.

Figure 3:
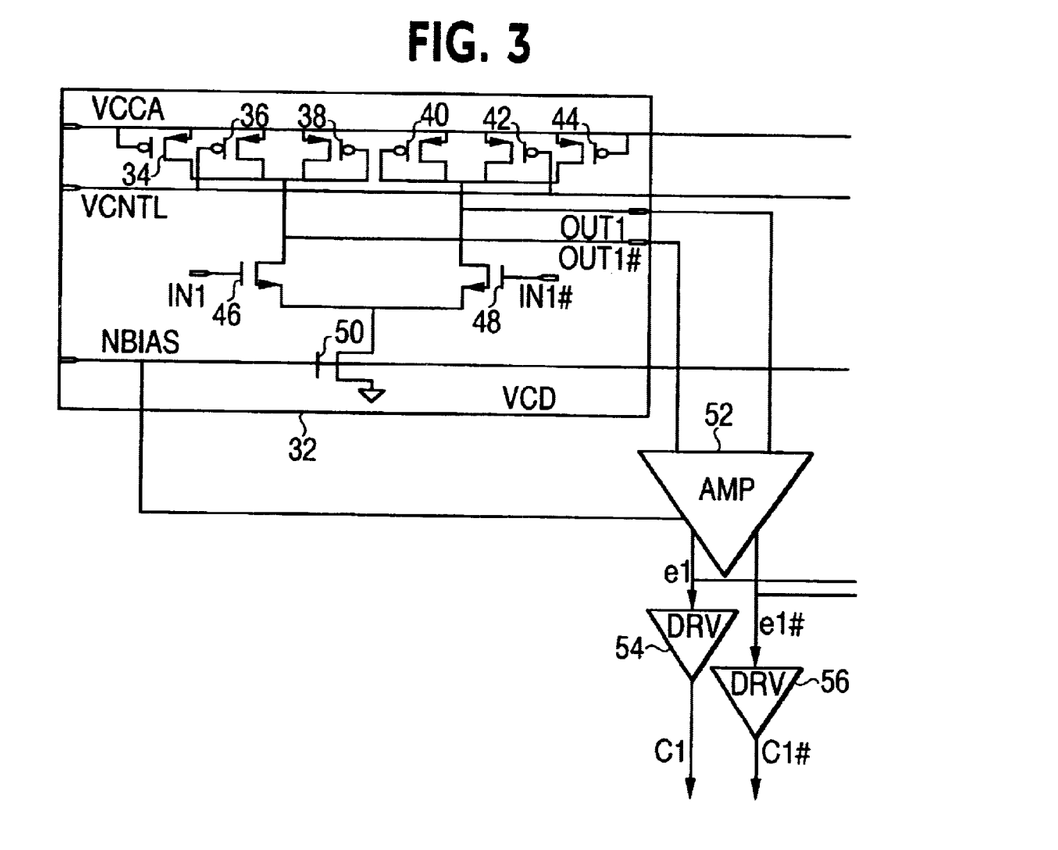
FIG. 3 is a schematic diagram of one stage of the delay line of FIG. 2.

FIG. 3 shows a single stage, or one delay element, 32 of the voltage controlled delay line 30. The element includes six PMOS transistors 34–44. One terminal of each transistor is connected to power input VCCA. Another terminal of each of a first group of transistors 34–38 are connected together. Likewise, one terminal of each of the second group of transistors 40–44 are connected together. In the first group, one gate terminal is connected to power input VCCA. A second gate is connected to the common terminal of the group. The third gate is connected to the voltage control signal VCNTL. Likewise, in the second group one gate is connected to the power input, one gate is connected to common terminal and one gate is connected to the voltage control signal.

Three NMOS transistors 46–50 are also included in the delay element. One terminal of transistor 46 is connected to the common terminal of the first group of transistors. Likewise, one terminal of transistor 48 is connected to the common terminal of the second group of transistors. A second terminal of transistors 46 and 48 are connected together and are also connected to a first terminal of transistor 50. The third terminal of transistors 46 and 48 are connected to an input clock signal and its inverse. The second terminal of transistor 50 is connected to ground and the third terminal is controlled by the Nbias signal.

The six transistors 34–44 act as a resistance to help control the delay of the clock signal. By changing the voltage on the control signal VCNTL, the resistance of the two groups of transistors is changed, thus changing the characteristics of the delay element. Likewise, the Nbias signal controls the bias applied by transistor 50 to the second terminals of transistors 46 and 48, which affects the delay. Thus, the time characteristics of transistors 46 and 48 are controlled by the other transistors which in turn are controlled by the Nbias and VCNTL signals. Output clock signals are taken from transistors 46 and 48 and applied through amplifier 52 to the next stage of the delay line as input clock signals. These signals are also applied to drivers 54 and 56 which send the same signals as output periodic clock signals.

Figure 4:
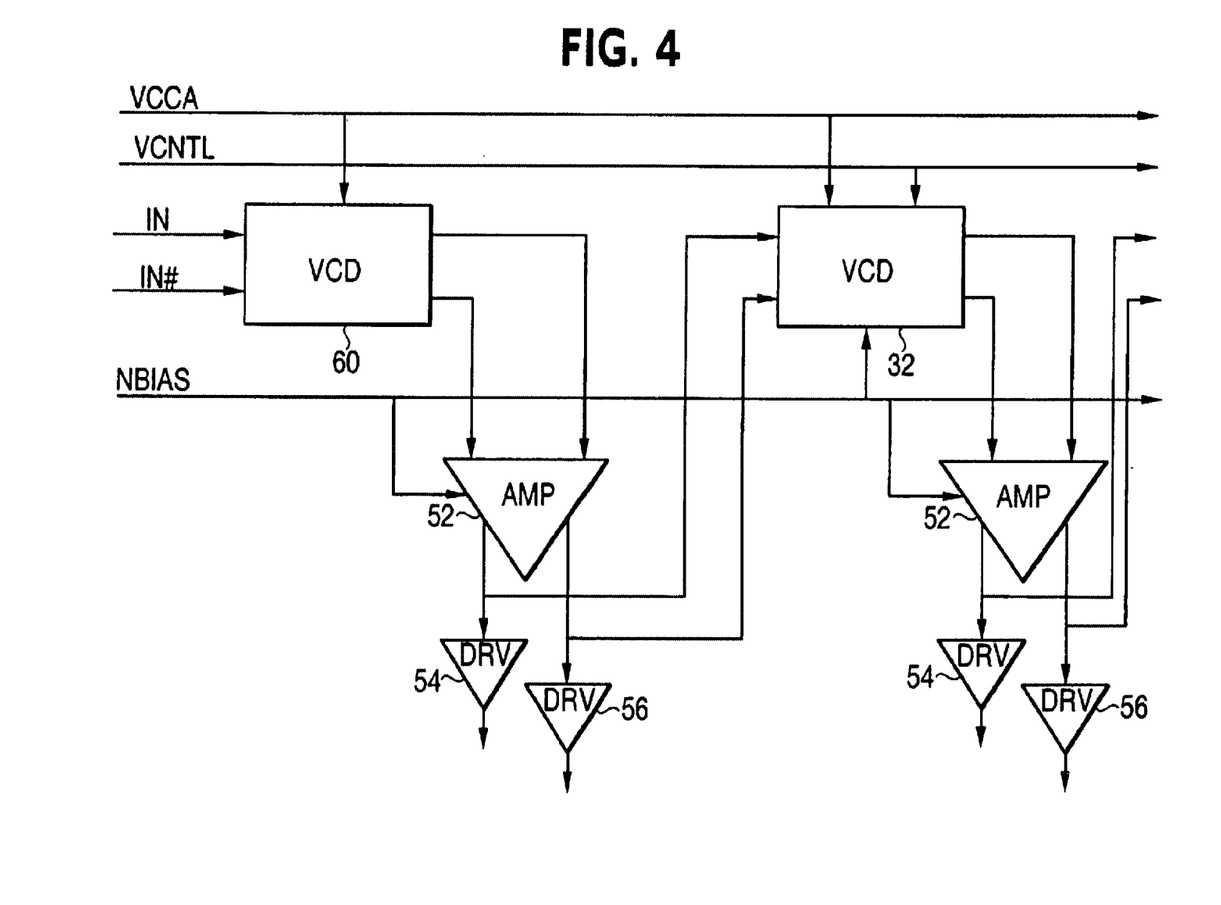
FIG. 4 is a schematic diagram of the initial stage of the delay line of FIG. 2.

However, as discussed above, this type of arrangement does not solve the problem of the latching of the final signal to the first signal of the next cycle. As seen in FIG. 4, the present invention provides a special voltage controlled element for the first stage of the delay line. For this one stage, the delay is not controlled by a voltage signal, but is instead a fixed delay. Thus, delay element 60 replaces delay element 32 in the initial stage of the delay line. Delay element 60 is not connected to the Nbias and VCNTL signals and thus is not controlled from outside, but is instead connected to a fixed voltage which leads to a constant delay value. This is accomplished by connecting the gates of transistors 36, 42 and 50 to a constant voltage rather than a varying voltage. In doing this, the delay for the stage is set to a constant value and the latching between the initial stage of one cycle and the final stage of previous cycle is removed. As a result, the extremely large or extremely small final signal in a cycle is prevented. This permits the loop to acquire lock in a shorter time.

Another part of the system which is improved is the phase detector. Typically, such phase detectors utilize logic circuits which logically combine the clock and feedback clock signals to produce up and down output signals. However, as indicated above, during acquisition both the up and down signals are present according to prior art devices. The present invention utilizes additional logic circuits to eliminate the extraneous up or down signal, so that only one of the signals is present during acquisition. This also permits the loop to acquire lock in a shorter time.

Figure 6A:
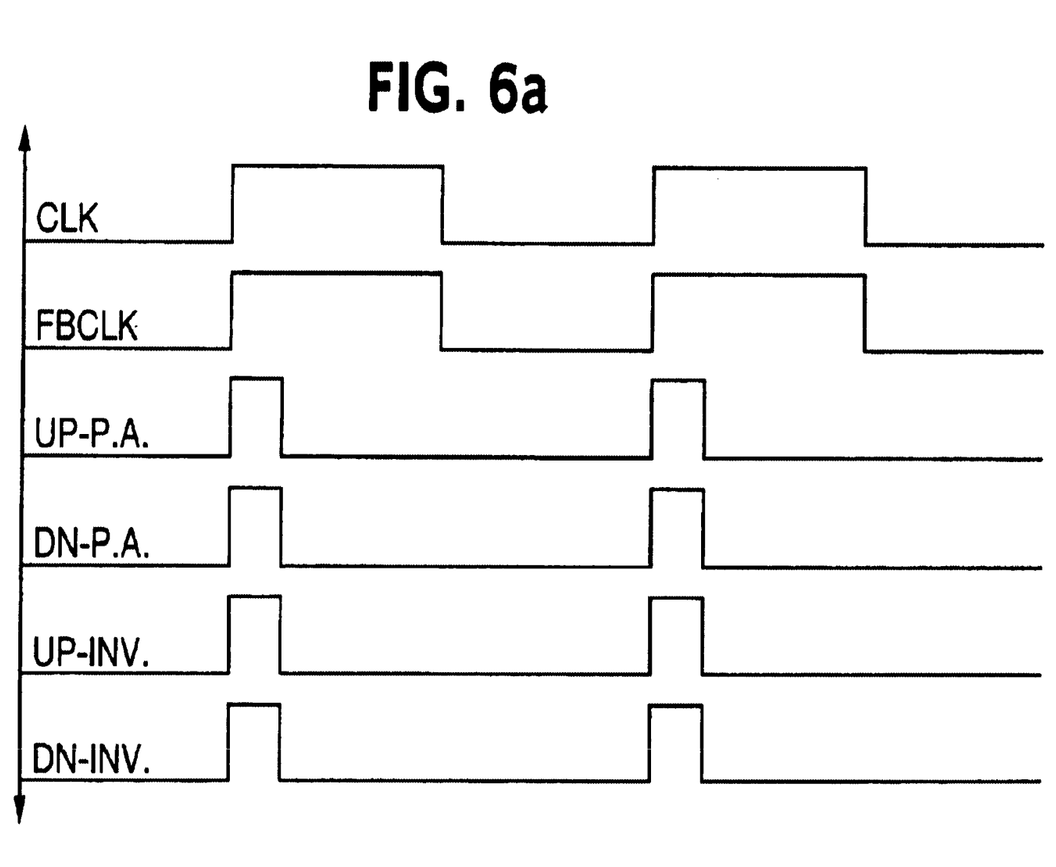
FIGS. 6a–6c are phase detector waveforms of the phase detector of FIG. 2.

FIG. 6a shows six waveforms which occur during lock conditions. The first waveform is the input clock signal. The second waveforms is the feedback clock signal. During lock conditions these two signals are in phase as can be seen. The third and fourth waveforms are the up and down signals in the prior art device. The fifth and sixth waveforms are the up and down signals according to the present invention. As can be seen in this Figure, during lock conditions there is no difference between the prior art signal and the present invention signal. During lock the up and down waveforms are exactly the same.

Figure 6B:
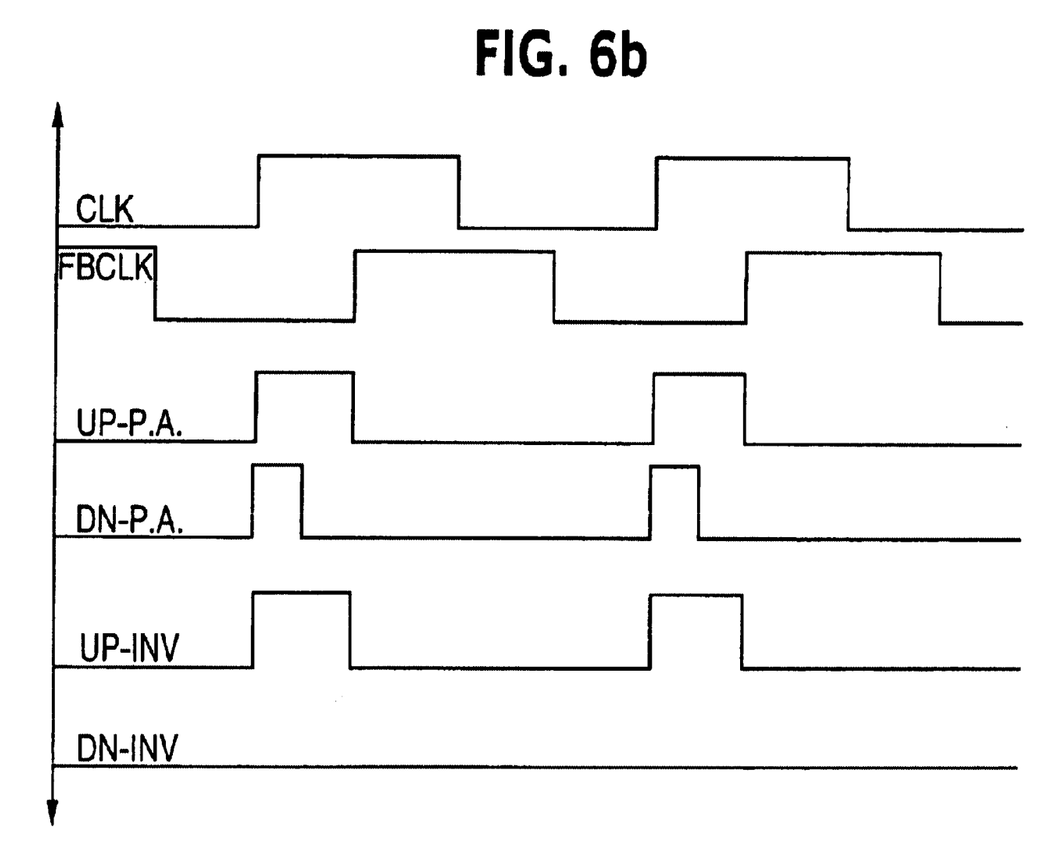

FIG. 6b shows the same six waveforms but during acquisition conditions. As can be seen in the first two waveforms, the clock and feedback clock signals are no longer in phase. Accordingly, in the prior art device the up signal shown in the third waveform has a width greater than the down signal shown in the fourth waveform. However, in the present invention the up signal retains this greater width, but eliminates the down signal completely.

Figure 6C:
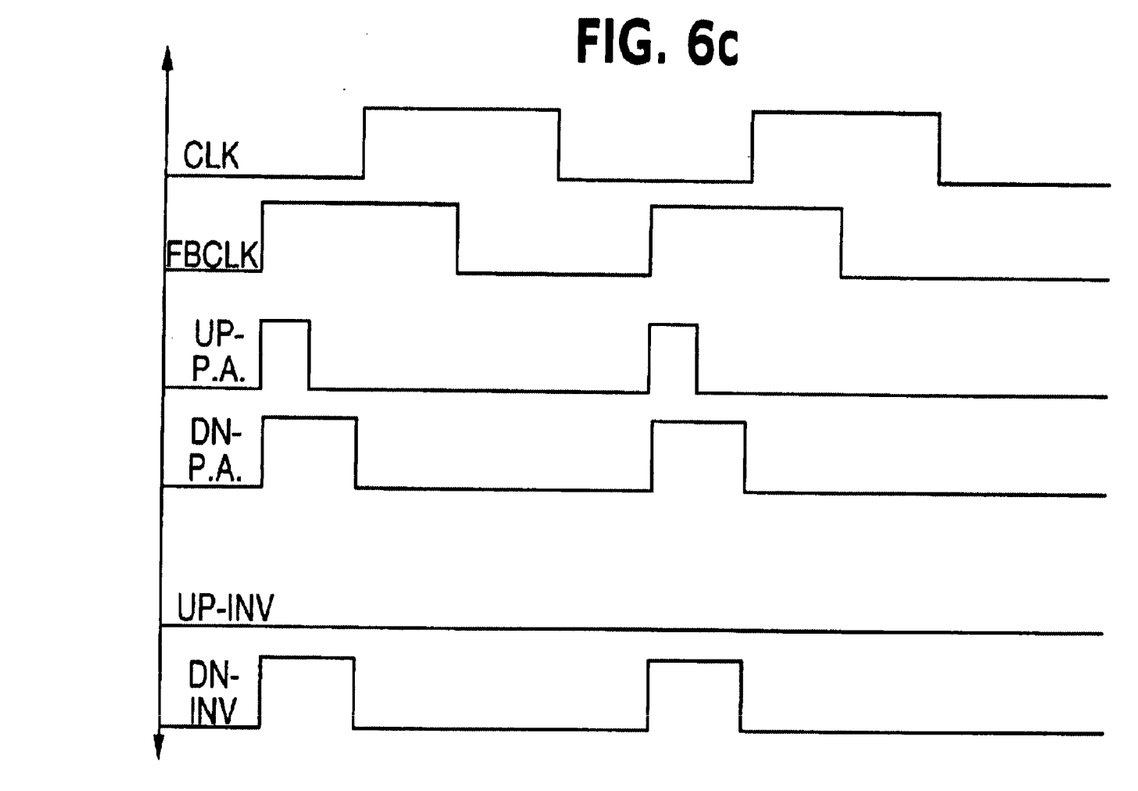

FIG. 6c shows the same six waveforms during acquisition conditions where the first two signals are out of phase in the other direction. In the prior art device shown in the third and fourth waveforms, the down signal has a greater width than the up signal. In the present invention, the down signal retains the greater width, but the up signal is eliminated completely.

Figure 5:
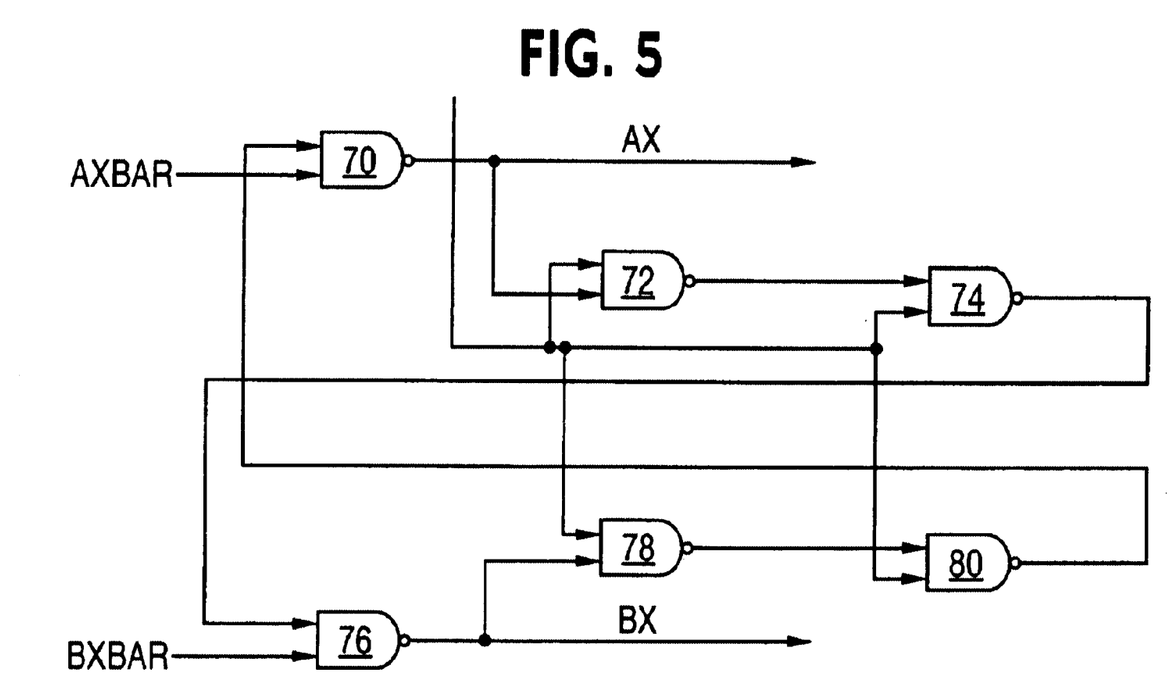
FIG. 5 is a logic diagram of part of the phase detector of FIG. 2.

The logic circuit for accomplishing the elimination of the extraneous signal the shown in FIG. 5. This circuit includes a series of NAND gates, some of which are combined to form delay elements. Two inputs are provided, one related to the up signal and one related to the down signal. These signals are indicated as axbar and bxbar. These signals are derived from logic gates which are seen in prior art devices. In the prior art, these signals are used to directly form the up and down signals. However, in the present invention, the NAND gate arrangement shown in FIG. 5 is used to remove the extraneous signal as discussed above and as seen in the waveforms of FIGS. 6a–6c. The particular logic gating used to form axbar and bxbar is described by the logic equations $$clk \text{ AND } x = clk \text{ AND } ((clk \text{ AND } fbclk) \text{ OR } ((clk \text{ OR } fbclk) \text{ AND } x)) \rightarrow axbar$$

$$fbclk \text{ AND } x = fbclk \text{ AND } ((clk \text{ AND } fbclk) \text{ OR } ((clk \text{ OR } fbclk) \text{ AND } x)) \rightarrow bxbar$$

The first input signal axbar is applied to first NAND gate 70. The output signal from this gate, ax, will be high as long as at least one of the two inputs to this gate is not high. Likewise, NAND gate 76 receives the other input signal bxbar and generates an output signal bx as long as one of the two inputs to this gate is not high. Gates 72 and 78 receive at one input the input signals axbar and bxbar, respectively. The other input to each of these gates is connected to the power input as indicated by the vertical line extending to the top of the Figure. Since this power input is always high, the output of these gates will be low when the input signals axbar and bxbar are high and thus, these gates act as inverters. Gates 74 and 80 receive the outputs of gates 72 and 78, respectively, at one input and the same power signal at gate other input. Since the power input is always high, the output of these gates will be high when the outputs of gates 72 and 78 are low. Thus when ax and bx are high, the outputs of gates 74 and 80 will also be high. However, there is a delay which is incurred in passing the signal through the pairs of gates acting as a pair of inverters. The output of gate 74 is fed back to form the other input to gate 76 and correspondingly, the output of gate 80 is fed back to form the other input to gate 70.

Gate 70 will therefore produce an output signal ax if an input signal axbar is high and if the output signal bx from gate 76, after being delayed, is not present. If bx is present it will prevent ax from being produced. Likewise, if bxbar is high, gate 76 will produce an output bx as long as ax, as delayed, is not present. The delay caused by the pairs of NAND gates depends on the characteristics of the circuits involved. These characteristics can be chosen so that a specific delay time can be implemented.

Referring now to FIGS. 6b and 6c, it is again seen that in the prior art, the up and down signals have different widths. Since the axbar and bxbar signals are related to the prior art up and down signals, they also would go high at the beginning of the up-and-down signals. Both the ax and bx signals would go high except that the feedback signals from the delay pairs cause them both to become low. This situation continues until one of the input signals goes low. For example, in FIG. 6b, the down signal goes low first and likewise the bxbar signal would do the same. This would cause a feedback signal from logic gate 80 to go low thus allowing gates 72 create a high ax signal and thus a high up signal while the down signal is suppressed.

For the situation in FIG. 6c, the inverse occurs where the up signal goes low first along with the axbar signal so that a feedback signal from logic gate 74 allows gate 76 to form a high bx signal and thus a high down signal while the up signal is suppressed. The result is that in the present invention, the extraneous signal is suppressed completely rather than merely being smaller than the desired signal. The result is that lock is acquired more quickly than with the prior art.

By utilizing this arrangement of phase detector along with the fixed delay initial stage of the delay line, a particularly effective delay locked loop is formed. However, it is possible to utilize either of these improvements without the other to gain some of the advantages of such a loop.

Numerous additional modifications and variations of the present invention or possible in light of the above teachings. It is therefore to be understood that within the scope of the appended claims, the invention may be practiced otherwise than as specifically described herein.

What is claimed is:

1. A delay locked loop, comprising:
    a controlled delay line having a clock input and including a series of stages each producing a clock output;
    a phase detector connected to two of said clock outputs and producing phase difference signals and;
    a charge pump receiving said phase difference signals and producing a voltage control signal;
    one of said series of stages having a fixed delay and others of said series of stages having a delay controlled by said voltage control signal.

2. The delay locked loop according to claim 1, further comprising:
    a generator connected to said charge pump and generating a signal for controlling said delay in said remainder of said series of stages.

3. The delay locked loop according to claim 1, further comprising:
    a buffer for receiving said phase difference signals from said phase detector and producing buffered phase difference signals which are applied to said charge pump.

4. The delay locked loop according to claim 1, wherein each of said stages includes two NMOS transistors receiving clock signals at gate terminals.

5. The delay locked loop according to claim 4, wherein each of said stages further includes a third NMOS transistor applying a bias to a second terminal of said two NMOS transistors.

6. The delay locked loop according to claim 4, wherein each of said stages further includes a plurality of PMOS transistors acting as a resistance and connected to a second terminal of said two NMOS transistors, wherein said resistance is controlled by a voltage signal.

7. The delay locked loop according to claim 4, wherein each of said stages includes an amplifier receiving output signals from said two NMOS transistors and producing clock outputs and clock inputs for the following stage.

8. A delay locked loop, comprising:
    a controlled delay line having a clock input and including a plurality of delay elements to produce a plurality of clock outputs, at least one of the delay elements having a fixed delay and at least another one of the delay elements having a variable delay;
    a phase detector connected to two of said plurality of clock outputs and producing up and down signals, only one of said up and down signals being produced during acquisition; and
    a charge pump receiving said up and down signals and producing a control signal for controlling said controlled delay line.

9. The delay locked loop according to claim 8, said phase detector including a logic circuit including cross coupled delays connected to said up and down signals.

10. The delay locked loop according to claim 9, wherein said logic circuit is comprised of NAND gates.

11. The delay locked loop according to claim 10, wherein each cross coupled delay includes two NAND gates.

12. A delay locked loop, comprising:
    a controlled delay line having a clock input and including a series of stages each producing a clock output;
    a phase detector connected to two of said clock outputs and producing up and down signals, only one of said up and down signals being produced during acquisition and;
    the charge pump receiving said up and down signals and producing a control signal;
    one of said series of stages having a fixed delay and others of said series of stages having a delay controlled by said control signal.

13. The delay locked loop according to claim 12, further comprising:
    a generator connected to said charge pump and generating a signal for controlling said delay in said remainder of said series of stages.

14. The delay locked loop according to claim 12, further comprising:
    a buffer for receiving said up and down signals from said phase detector and producing buffered up and down signals which are applied to said charge pump.

15. The delay locked loop according to claim 12, wherein each of said stages includes two NMOS transistors receiving clock signals at gate terminals.

16. The delay locked loop according to claim 15, wherein each of said stages further includes a third NMOS transistor applying a bias to a second terminal of said two NMOS transistors.

17. The delay locked loop according to claim 15, wherein each of said stages further includes a plurality of PMOS transistors acting as a resistance and connected to a second terminal of said two NMOS transistors, wherein said resistance is controlled by a voltage signal.

18. The delay locked loop according to claim 15, wherein each of said stages includes an amplifier receiving output signals from said two NMOS transistors and producing clock outputs and clock inputs for the following stage.

19. A method for producing clock pulses comprising:
    providing a clock input to a delay line, said delay line having a series of stages each producing a clock output;
    connecting two of said clock outputs to a phase detector to produce phase difference signals; and
    producing a control signal in a charge pump based on said phase difference signals;

controlling one of said series of stages to have a fixed delay and controlling others of said series of stages by said control signal.

20. The method according to claim 19, further comprising:

generating a signal in a generator connected to said charge pump to control said delay in said other of said series of stages.

21. A delay locked loop, comprising:

a controlled delay line having a clock input and including a plurality of delay elements to produce a plurality of clock outputs, at least one of the delay elements being coupled to a fixed control voltage and other ones of the delay elements being coupled to a variable control voltage line;

a phase detector connected to two of said plurality of clock outputs and producing up and down signals, only one of said up and down signals being used at any given time to effect acquisition; and a charge pump receiving said only one of said up and down signals at any given time and producing a control signal on the variable control voltage line for controlling said controlled delay line responsive thereto.

22. A delay locked loop according to claim 21, said phase detector including a logic circuit including cross coupled delays connected to said up and down signals.

23. An electronic system comprising:

a power supply;

a system memory; and a delay locked loop, including:
 a controlled delay line having a clock input and including a series of stages each producing a clock output;
 a phase detector connected to two of said clock outputs to produce phase difference signals; and
 a charge pump to receive said phase difference signals and produce a voltage control signal;
 one of said series of stages having a fixed delay and others of said series of stages having a delay controlled by said voltage control signal.

24. An electronic system as claimed in claim 23, further comprising:

a buffer to receive said phase difference signals from said phase detector and produce buffered phase difference signals which are applied to said charge pump.

25. An electronic system comprising:

a power supply;

a system memory; and a delay locked loop, including:
 a controlled delay line having a clock input and including a plurality of delay elements to produce a plurality of clock outputs, at least one of the delay elements being coupled to a fixed control voltage and other ones of the delay elements being coupled to a variable control voltage line;
 a phase detector connected to two of said plurality of clock outputs and producing up and down signals, only one of said up and down signals being used at any given time to effect acquisition; and
 a charge pump receiving said only one of said up and down signals at any given time and producing a control signal on the variable control voltage line for controlling said controlled delay line responsive thereto.

26. A delay looked loop according to claim 25, said phase detector including a logic circuit including cross coupled delays connected to said up and down signals.

* * * * *